(12) United States Patent
Deimling

(10) Patent No.: US 6,891,373 B2
(45) Date of Patent: May 10, 2005

(54) METHOD TO DETERMINE THE ADC COEFFICIENTS IN DIFFUSION-WEIGHTED MAGNETIC RESONANCE IMAGING GIVEN USE OF STEADY-STATE SEQUENCES

(75) Inventor: Michael Deimling, Möhrendorf (DE)

(73) Assignee: Siemens Aktiengesellschaft, Münich, DEX ( * ) Notice: Subject to any disclaimer, the term of this patent is extended or adjusted under 35 U.S.C. 154(b) by 0 days.

(21) Appl. No.: 10/699,083

(22) Filed: Oct. 31, 2003

(65) Prior Publication Data

US 2004/0140803 A1 Jul. 22, 2004

(30) Foreign Application Priority Data

Oct. 31, 2002 (DE) .......................................... 102 50 922

(51) Int. Cl.[7] .................................................. G01V 3/00
(52) U.S. Cl. ..................................... 324/309; 324/307
(58) Field of Search ............................... 324/309, 307, 324/318, 322; 600/410

(56) References Cited

U.S. PATENT DOCUMENTS 5,833,609 A  * 11/1998 Dannels et al. ............. 600/410
6,670,812 B1 * 12/2003 Mock et al. ................. 324/309

OTHER PUBLICATIONS

"The Diffusion Sensitivity of Fast Steady–State Free Precession Imaging," Buxton, Magnetic Resonance in Medicine, vol. 29, (1993) pp. 225–243.

"A New Diffusion SSFP Imaging Technique," Zur et al., Magnetic Resonance in Medicine, vol. 37 (1997) pp. 716–722.

"High Resolution Renal Diffusion Imaging Using a Modified Steady–State Free Precession Sequence," Ding et al., Magnetic Resonance in Medicine, vol. 34 (1995) pp. 596–595.

"NMR Diffusion Coefficient Mapping by Use of Fast Steady–State Free Precession Sequence," Chu et al., Proc. Society of Magnetic Resonance in Medicine, Amsterdam (1989) p. 911.

* cited by examiner

Primary Examiner—Brij B. Shrivastav
(74) Attorney, Agent, or Firm—Schiff Hardin LLP

(57) ABSTRACT

In a magnetic resonance apparatus and method to acquire a diffusion-weighted image in diffusion-weighted MRT imaging, a non-diffusion-weighted data set and a diffusion-weighted data set are measured and stored by means of a DESS sequence (Double Echo Steady State Sequence), with two readout gradients being switched successively for the non-diffusion-weighted data set, and a bipolar diffusion gradient pulse sequence being switched between two readout gradients for the diffusion-weighted data set. A diffusion-weighted MRT image is calculated is calculated based on the non-diffusion-weighted data set and the diffusion-weighted data set, as well as on the basis of a value characterizing the diffusion-weighted measurement.

16 Claims, 9 Drawing Sheets

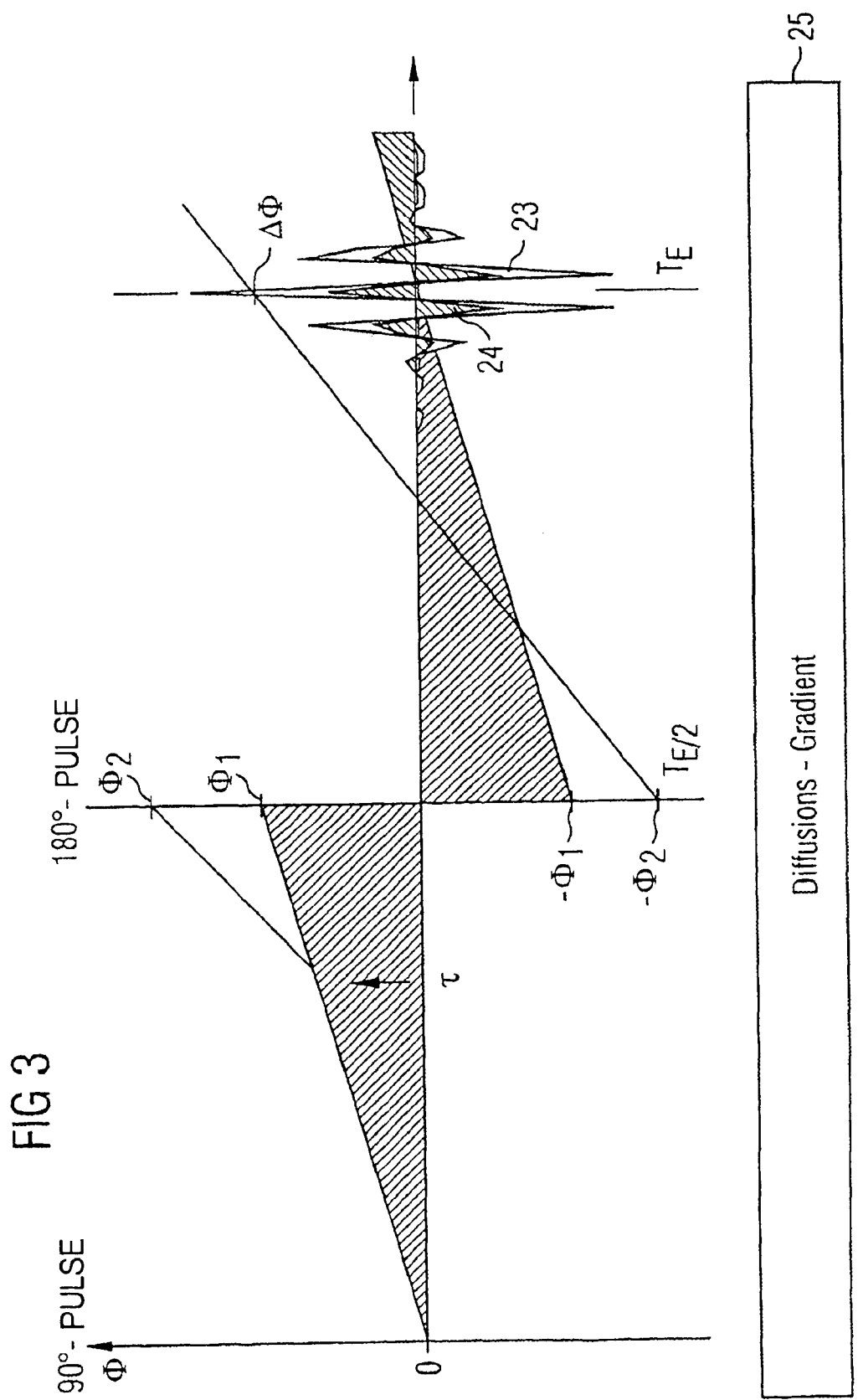

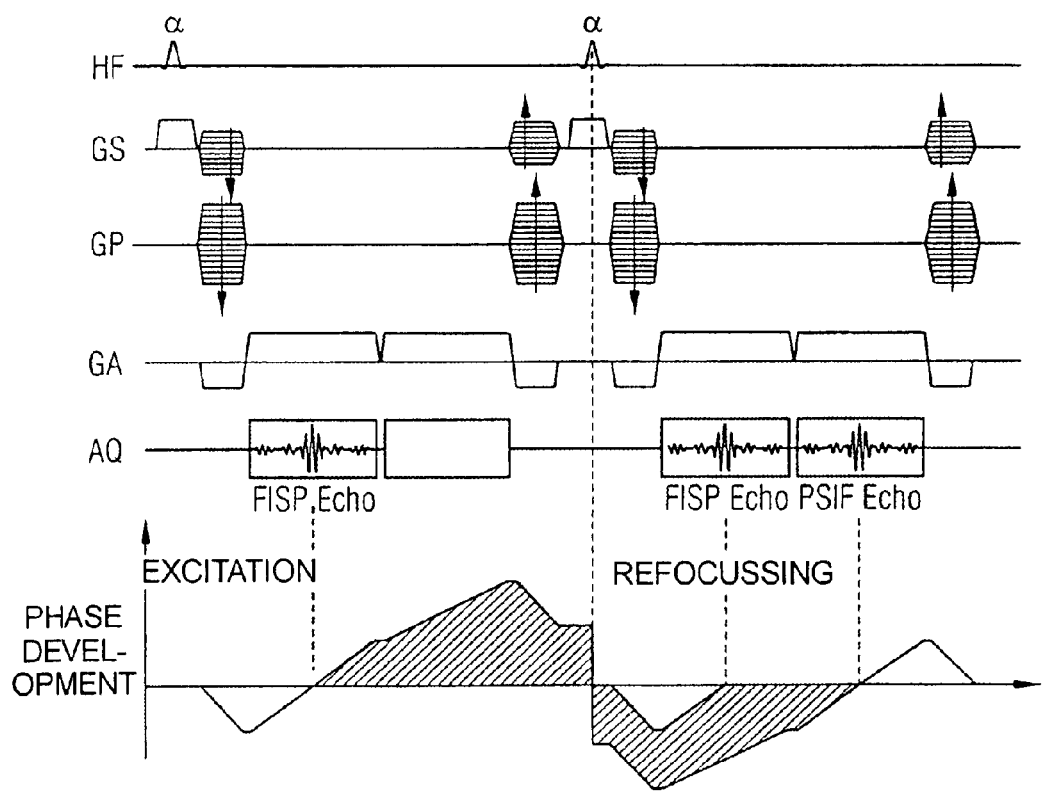

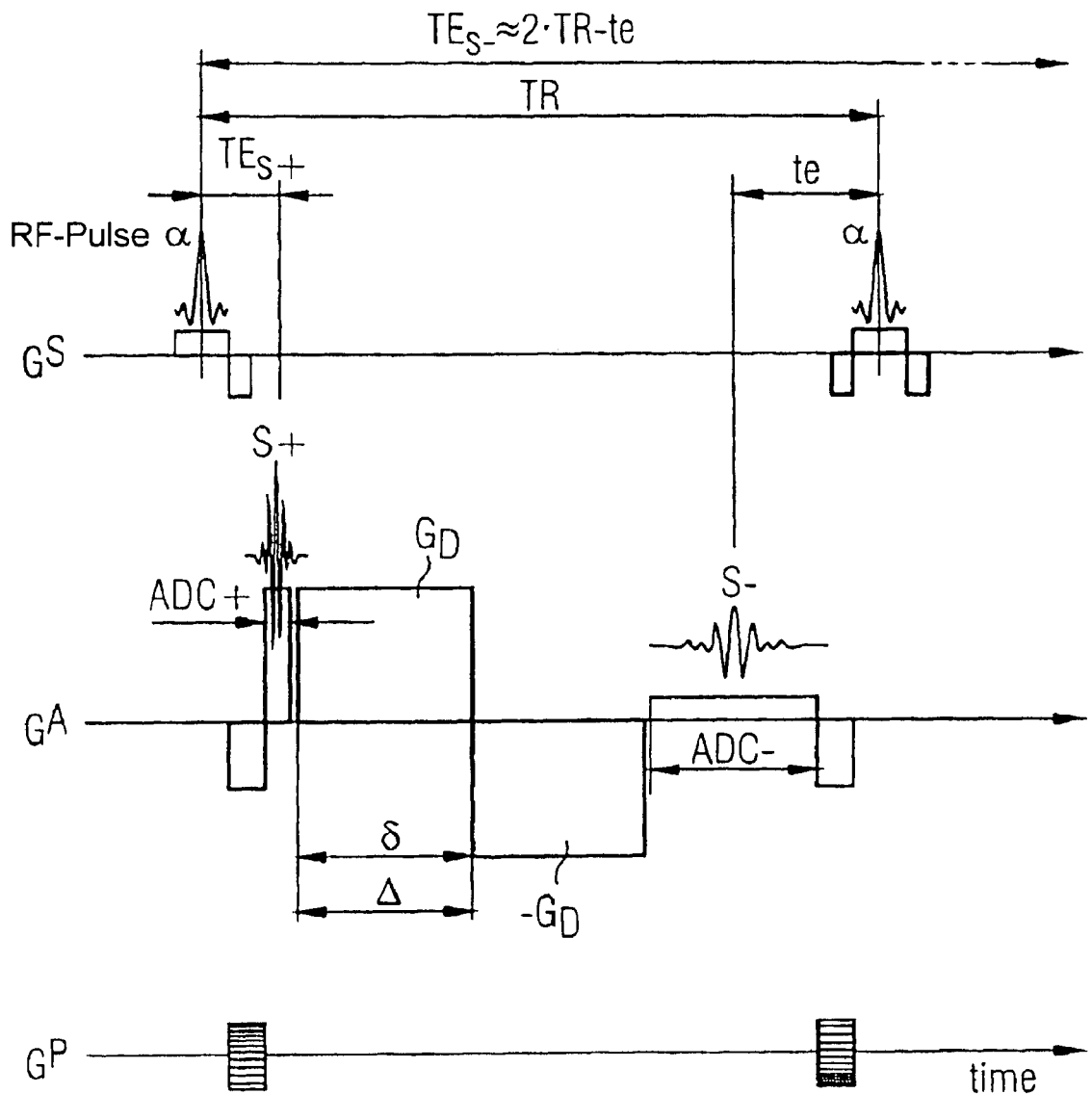

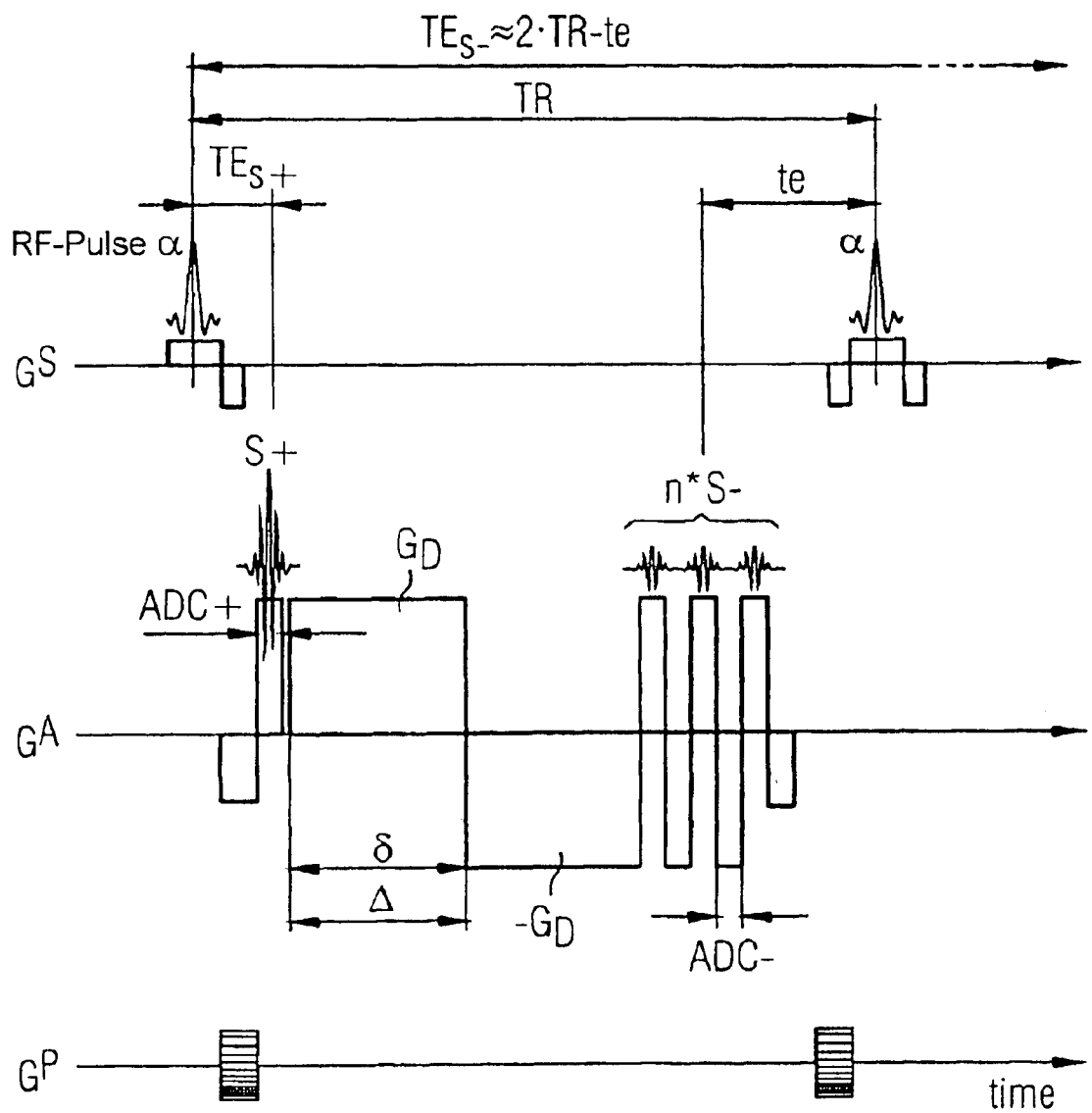

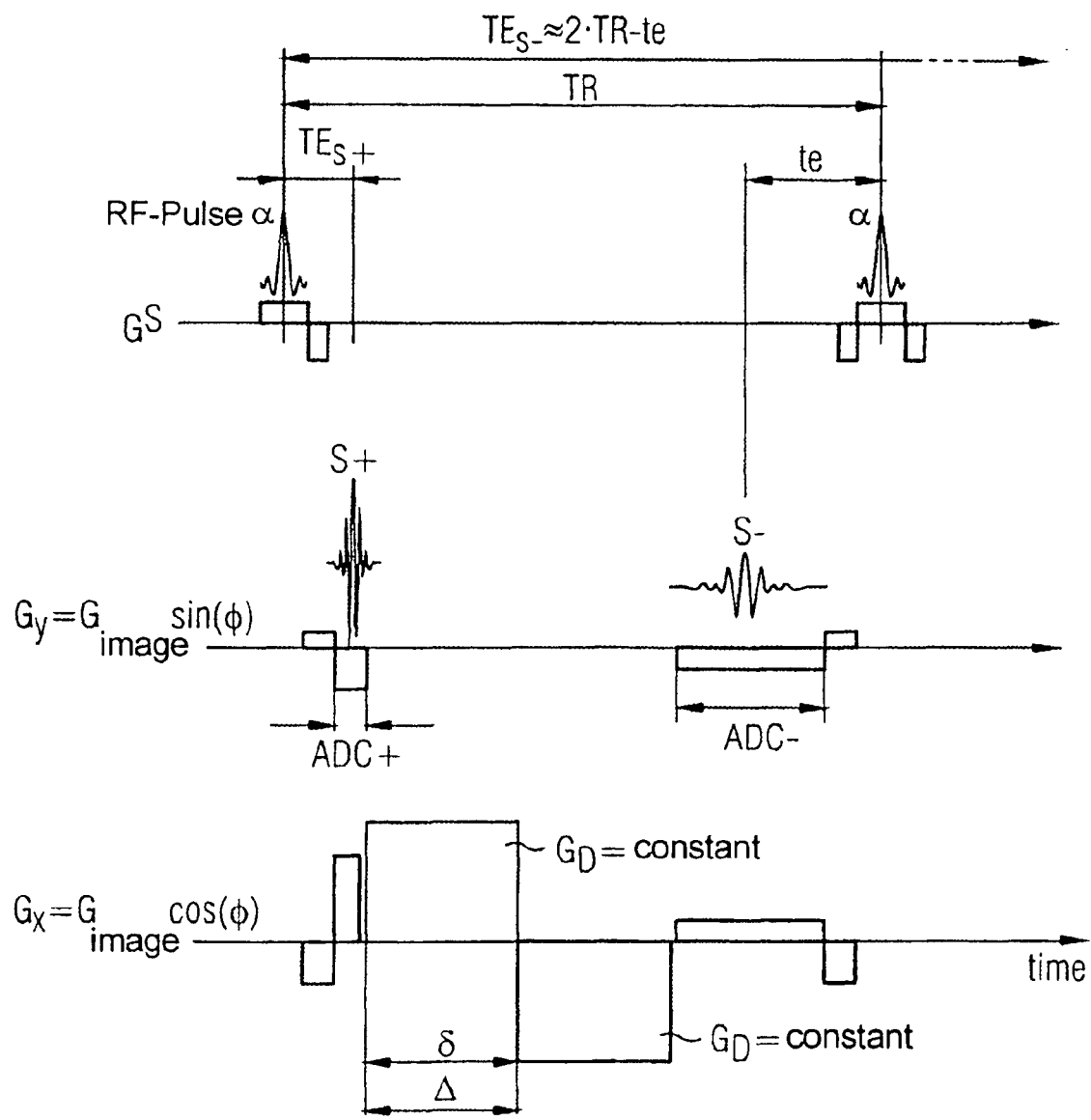

METHOD TO DETERMINE THE ADC COEFFICIENTS IN DIFFUSION-WEIGHTED MAGNETIC RESONANCE IMAGING GIVEN USE OF STEADY-STATE SEQUENCES

BACKGROUND OF THE INVENTION

1. Field of the Invention

The present invention in general concerns magnetic resonance tomography (MRT) as applied in medicine to examine patients. The present invention concerns in particular concerns a method to determine the ADC coefficients in diffusion-weighted magnetic resonance imaging.

2. Description of the Prior Art

MRT is based on the physical phenomenon of nuclear magnetic resonance and has been successfully used as an imaging method for over 15 years in medicine and biophysics. In this examination modality, the subject is exposed to a strong, constant magnetic field. The nuclear spins of the atoms in the subject, which were previously randomly oriented, thereby align. Radio-frequency energy can now excite these "ordered" nuclear spins to a specific oscillation. This oscillation generates the actual measurement signal that is acquired by appropriate reception coils. By the use of inhomogeneous magnetic fields generated by gradient coils, the signals from the measurement subject can be spatially coded in all three spatial directions, what is generally known as "spatial coding".

In the assessment of pathophysiological events, in particular in the human brain (for example given a stroke), a relatively new MR technique has proven to be particularly effective: diffusion-weighted magnetic resonance tomography.

Diffusion ensues by the thermal translation movement of molecules. It is a random process that is also known as Brownian molecular motion. The distances traveled by the molecules observed in diffusion-weighted MRT measurements are very small; for example, unrestricted diffused water molecules typically in any arbitrary direction over a distance of approximately 20 μm in 100 ms or 60 μm in 1 s. These distances lie in the range of individual cells, in particular in human tissue. By the use of strong magnetic gradient fields (what are known as diffusion gradients), that, in this technique, are applied permanently or also in pulses in addition to the spatially coded gradient fields described above, a collective diffusion movement of the respective molecules (in particular water) becomes noticeable as a weakening of the magnetic resonance signal. Regions in which diffusion ensues are more or less indicated as dark regions in actual MRT images, depending on the strength of the diffusion, which is dependent on various factors. The precise theory of the signal origin in diffusion-weighted imaging is explained below.

A problem in the early development of diffusion-weighted imaging was the marked sensitivity to non-diffusion-associated movements, such as heart motion, respiratory motion and so forth, and the motions connected with these, such as for example brain pulsation (movement of the brain in cerebrospinal fluid). The use of diffusion imaging as a clinical examination method has for the first time made possible the continuous development of faster measurement techniques, such as for example echoplanar imaging (EPI). EPI is a markedly faster measurement method in MRT. Given the use of single-shot echo-planar imaging (SSEPI) sequences, image artifacts that ensue due to unpreventable movement types can be reduced or prevented. Movements as ensue in conventional diffusion-weighted imaging sequences can be effectively "frozen" with SSEPI. A disadvantage caused by the type of phase coding of an SSEPI sequence, however, is the very strong T2*(T2* is the decay duration of the transverse magnetization due to local magnetic field inhomogeneities.) and the very strong phase sensitivity. Both result in strong image artifacts or distortion artifacts, in particular in body imaging with typically short T2 times of human tissue.

"Non-EPI sequences" (generally called steady-state sequences), such as, for example, FISP (Fast Imaging With Steady Precession) and PSIF (the reverse of FISP), generally use the typical spin warp phase coding technique (discrete phase incrementing by means of a phase coding gradient) and are non-sensitive with regard to the artifacts described above. Typically, in such a sequence a monopolar (positive or negative) diffusion gradient (as a rule pulse-type) is switched with a radio-frequency excitation pulse of α<90°. Independent of diffusion gradients, such a radio-frequency pulse α can have three different influences on a magnetization vector:

1. tilting the magnetization vector by the flip angle α relative to the longitudinal direction (z-axis),
2. inverting the magnetization vector by 180°, and
3. no effect at all on the magnetization vector.

As is explained below in detail, due to these three properties of the radio-frequency excitation pulse, different branched phase curves of the length magnetization and transverse magnetization (also called "echo paths") occur, each of which exhibits a different diffusion time $\Delta i$. Dependent on the phase path or the phase history (which again experiences an expansion via an applied diffusion gradient) the corresponding $T_1$-weighting and $T_2$ weighting is also a specific echo path during the entire phase curve. Overall, an MRT signal results which is formed by a combination of a number of echo paths and therefore exhibits a complexity that can no longer be calculated.

A diffusion-weighted MRT image results from the DADC value (Apparent Diffusion Coefficient, ADC coefficient) (determined per pixel) characterizing the diffusion, which can be calculated from the measurement signals of the employed sequence as well as from the b-value characterizing the measurement. For this, in a diffusion-weighted PSIF sequence with monopolar diffusion gradient pulses in the integration of all echo paths, the respective T1 values and T2 values, as well as the flip angle distribution α(z) of the real radio-frequency pulse used over the selected slice, must be known exactly (R. Buxton, J. of Magnetic Resonance in Medicine 29, 235–243 (1993)). This is not the case in the previously used (steady-state) sequences, thus a precise calculation of the DADC value is not possible in the context of an exact T2 weighting. The results are diffusion-weighted images that exhibit severe artifacts.

For this reason, Y. Zur, E. Bosak, N. Kaplan propose in the Journal of Magnetic Resonance in Medicine 37, 716–722 (1997) to use a bipolar diffusion gradient in place of a monopolar diffusion gradient. The expansion effected by the diffusion gradients thereby is compensated by the phase curves. The diffusion time Δ is thereby well defined, and an ADC calculation from two diffusion measurements is approximately possible with diffusion gradients differing with regard to amplitude.

Admittedly, it is known that, given use of bipolar diffusion gradients, the calculated diffusion coefficients are still strongly dependent on the respective T2 value, which likewise leads to significant artifacts (S. Ding, H. Trillaud et al., J. of Magnetic Resonance in Medicine 34, 586–595 (1995)).

M. H. Cho and C. H. Cho have theoretically shown in the conference volume "Society of Magnetic Resonance in Medicine", p. 911, Amsterdam (1989) that this T2 weighting can be eliminated given use of a bipolar diffusion coefficient, when a corresponding FISP signal (S+) is known and a corresponding formula is specified for the measured PSIF signal (S−).

SUMMARY OF THE INVENTION

It is an object of the present invention to measure in a particularly advantageous manner the measurement quantities required for this formula in order to enable an artifact-free calculation of the $D_{ADC}$ value.

This object is achieved according to the invention, in a method to determine a diffusion-weighted image in diffusion-weighted MRT imaging wherein non-diffusion-weighted data set and a diffusion-weighted data set and measured and stored by means of a DESS sequence (Double Echo Steady State Sequence), wherein two readout gradients are switched [phased; operated] successively for the non-diffusion-weighted data set, and a bipolar diffusion gradient pulse sequence is switched between two readout gradients for the diffusion-weighted data set, and wherein a diffusion-weighted MRT image is calculated based on the non-diffusion-weighted data set and the diffusion-weighted data set, as well as on the basis of a value characterizing the diffusion-weighted measurement.

The bipolar diffusion gradient pulse sequence has positive and negative diffusion gradient pulses with the respective amplitudes $G_0$ and $-G_0$, and the same pulse width $\delta$. The diffusion gradient pulses inventively directly follow one after the other. This type of gradient switching compensates ensuing dephasing effects.

The calculation of the diffusion-weighted MRT image ensues by formation of the quotients of a combination of the diffusion-weighted data set and the non-diffusion-weighted data set, following logarithmization of the quotient as well as weighting with the b-value corresponding to the diffusion-weighted measurement.

The imaging of the diffusion-weighted MRT image inventively ensues by a per-pixel representation of the ADC coefficient $D_{ADC}$ that is likewise determined per pixel from the acquired data sets according to the formula $$D_{ADC} = \frac{1}{2 * b_{bip}} \ln \frac{S_0^- * S_{Diff}^+}{S_{Diff}^- * S_0^+}$$

wherein $S_0^+$ and $S_0^-$ represent the data set of the non-diffusion-weighted measurement in the form of FISP echo signals and in the form of PSIF echo signals, and $S_{Diff}^+$ and $S_{Diff}^-$ represent the data set of the diffusion-weighted measurement in the form of FISP echo signals and in the form of PSIF echo signals, and wherein $b_{bip}$ represents the value characterizing the diffusion-weighted measurement that is given according to the formula $$b_{bip} = \frac{1}{6} \gamma^2 G_0^2 \delta^3$$

by the condition of the bipolar diffusion gradient and the gyromagnetic ratio $\gamma$ of the nuclear resonance spin type in question.

The total measurement time can advantageously be substantially reduced in accordance with the invention when the S+ signal is measured with higher bandwidth in comparison to the S− signal.

In order to prevent artifacts from arising, it is advantageous to measure both signals S+ and S− with the same large bandwidth, with the S− signal being measured a number of times with a multi-gradient echo sequence and being averaged over the measured S− signals.

The average preferably is implemented with the quadratic sum method.

The acquisition of the data sets $S_{Diff}^-$, $S_{Diff}^+$, $S_0^-$, $S_0^+$ can likewise ensue in accordance with the invention via a projection-reconstruction method.

Furthermore, a magnetic resonance tomography device in accordance with the invention implements the above-described method steps.

DESCRIPTION OF THE DRAWINGS

FIG. 3 schematically illustrates the phase curve $\phi$ of the transverse magnetization, as well as the signal origin, in a spin-echo measurement under the influence of a constantly applied diffusion gradient.

FIG. 6 schematically illustrates the structure of a DESS sequence, as well as the respective phase development of the magnetization vectors given FISP and PSIF.

FIG. 7 is a first embodiment of the inventive MRT measurement sequence with a bipolar diffusion gradient and FISP and PSIF measurement.

FIG. 8 is a second embodiment of the inventive MRT measurement sequence with a bipolar diffusion gradient, FISP measurement and n-times multi-gradient echo measurement of a PSIF measurement.

FIG. 9 is a third embodiment of the inventive MRT measurement sequence with bipolar diffusion gradient and FISP and PSIF measurement using the projection-reconstruction method.

DESCRIPTION OF THE PREFERRED EMBODIMENTS

Figure 1:
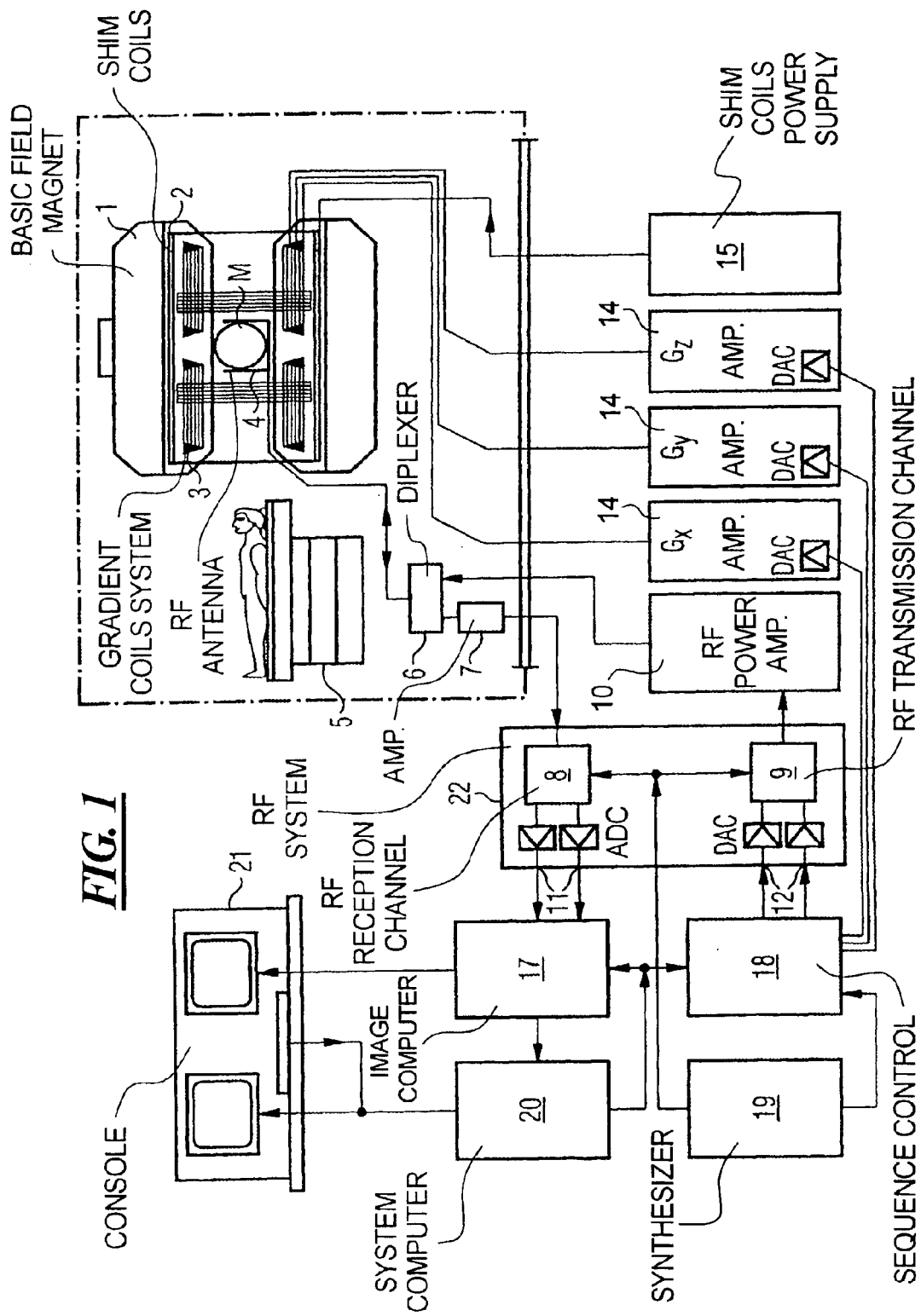
FIG. 1 is a schematic block diagram of a nuclear magnetic resonance tomography apparatus operable in accordance with the invention.

FIG. 1 schematically shows a nuclear magnetic resonance tomography device that generates gradient pulses according to the present invention. The assembly of the component of the magnetic resonance tomography device corresponds to that of a typical tomography device, but differs in operation as described below. A basic field magnet 1 generates a temporally constant strong magnetic field to polarize or align the nuclear spins in the examination region of a subject, such as for example a part of a human body to be examined. The high homogeneity of the basic field magnet required for the magnetic resonance measurement is defined in a spherical measurement volume M, into which the parts of the human body to be examined are moved. To support the homogeneity requirements, and in particular to eliminate temporally invariable influences, shim plates made of ferromagnetic material are mounted at appropriate locations.

Temporally variable influences are eliminated by shim coils 2 that are controlled by a shim power supply 15.

A cylindrical gradient coil system 3 is used in the basic field magnet 1 that is composed of three coils. The coils are supplied by respective amplifiers 14 to generate respective linear gradient fields in the directions of a Cartesian coordinate system. The first coil of the gradient system 3 generates a gradient $G_x$ in the x-direction, the second coil of the gradient field system 3 generates a gradient $G_y$ in the y-direction, and the third coil of the gradient field system 3 thereby generates a gradient $G_z$ in the z-direction. Each amplifier 14 has a digital-analog converter that is controlled by a sequence control 18 for timed generation of the gradient pulses.

A radio-frequency antenna 4 is located within the gradient field system 3 that converts the radio-frequency pulse emitted by a radio-frequency power amplifier 30 into a magnetic alternating field to excite the nuclei and align the nuclear spins of the subject to be examined, or of the region of the subject to be examined. The alternating field originating from the precessing nuclear spins, meaning as a rule the nuclear spin echo signals ensuing from a pulse sequence composed of one or more radio-frequency pulses and one or more gradient pulses, is also converted by the radio-frequency antenna 4 into a voltage that is supplied via an amplifier 7 to a radio-frequency reception channel 8 of a radio-frequency system 22. The radio-frequency system 22 has a transmission channel 9 in which the radio-frequency pulses are generated for the excitation of the nuclear magnetic resonance. The respective radio-frequency pulses are digitally represented in the sequence control 18 as a sequence of complex numbers based on a pulse sequence predetermined by the system computer 20. This number sequence is supplied via an input 12 as a real part and an imaginary part to a digital-analog converter in the radiation detector system 22, and supplied from this to a transmission channel 9. In the transmission channel 9, the pulse sequences are modulated by an radio-frequency carrier signal whose base frequency corresponds to the resonance frequency of the nuclear spins in the measurement volume.

The changeover from the transmission mode to the reception mode ensues via a transmission-reception diplexer 6. The radio-frequency antenna 4 radiates the radio-frequency pulses to excite the nuclear spins in the measurement volume M and samples the resulting echo signals. The correspondingly acquired magnetic resonance signals are phase-sensitively demodulated in the reception channel 8 of the radio-frequency system 22 and converted via a respective digital-analog converter into a real part and an imaginary part of the measurement signal. An image is reconstructed by an image computer 17 from the measurement data acquired in such a manner. The administration of the measurement data, the image data and the control program ensues via the system computer 20. Based on a specification with control programs, the sequence control 18 monitors the generation of the desired pulse sequences and the corresponding scanning of k-space. In particular, the sequence control 18 controls the timed switching of the gradients, the emission of the radio-frequency pulses with defined phase and amplitude, and the reception of the magnetic resonance signals. The time base for the radio-frequency system 22 and the sequence control 18 is provided by a synthesizer 19. The selection of corresponding control programs to generate a magnetic resonance image, as well as the representation of the generated nuclear magnetic resonance image, ensues via a terminal or console 21 that has a keyboard as well as one or more screens.

The present invention is directed to the design of new steady-state sequences, with which a diffusion-weighted MRT imaging, as well as the artifacts that ensue via motion, is substantially improved with regard to the complicated $T_2$ action. The inventive sequences are stored in the synthesizer 19 and implemented by the sequence control 18.

The theory and procedure of diffusion-weighted imaging are explained below in particular in connection with a spin-echo measurement.

The acquisition of the data ensues in MRT in k-space (frequency domain). The MRT image in the image domain is linked with the MRT data in k-space by Fourier transformation. The spatial coding of the subject, which spans the k-space, ensues in all three spatial directions by means of gradients. Differentiation is thereby made between the slice readout (establishes an acquisition slice in the subject, typically the z-axis), the frequency coding (establishes a direction in the slice, typically the x-axis) and the phase coding (determines the second dimension within the slice, typically the y-axis).

Thus, a slice is first selectively excited, for example in the z-direction. The coding of the spatial information in the slice ensues by a combined phase and frequency coding by means of both of these (already mentioned) orthogonal gradient fields, that in the example of a slice excited in the z-direction are generated by the (likewise already mentioned) gradient coils in the x-direction and the y-direction.

Figure 2A:
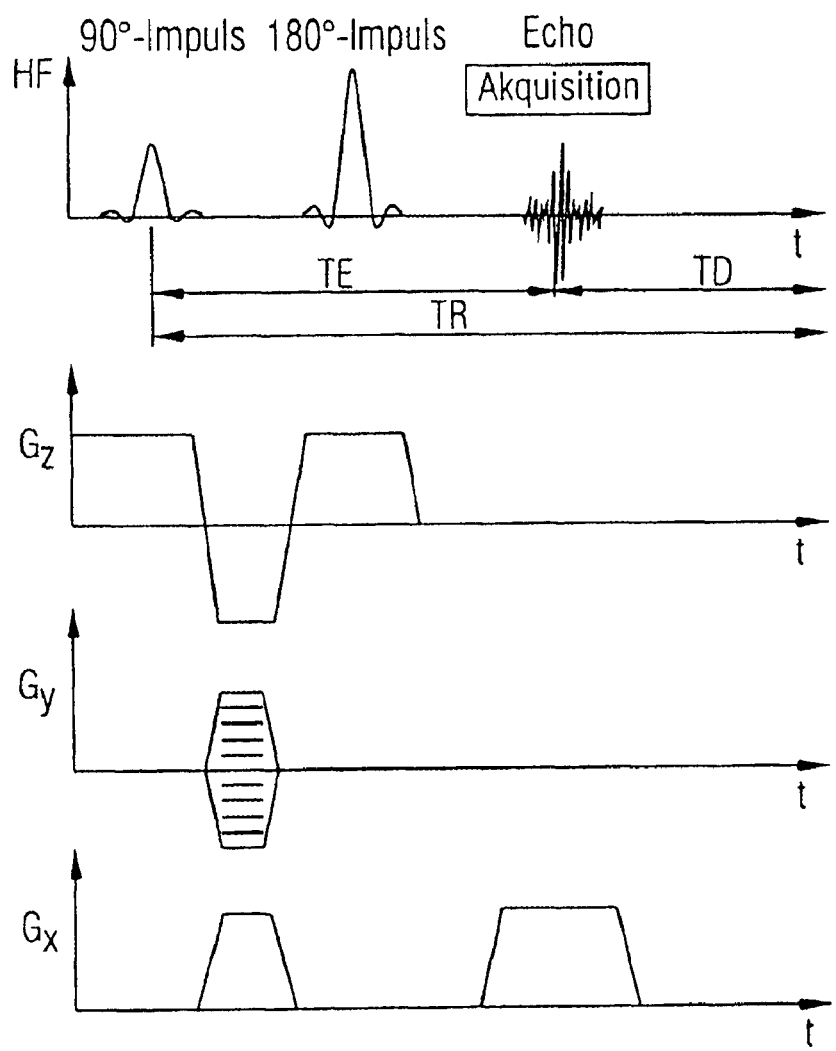
FIG. 2 schematically illustrates the time curves of the gradient pulses of a spin-echo sequence.
FIG. 2b schematically illustrates the temporal sampling of the k-matrix (k-space) in a spin-echo sequence.
Figure 2B:
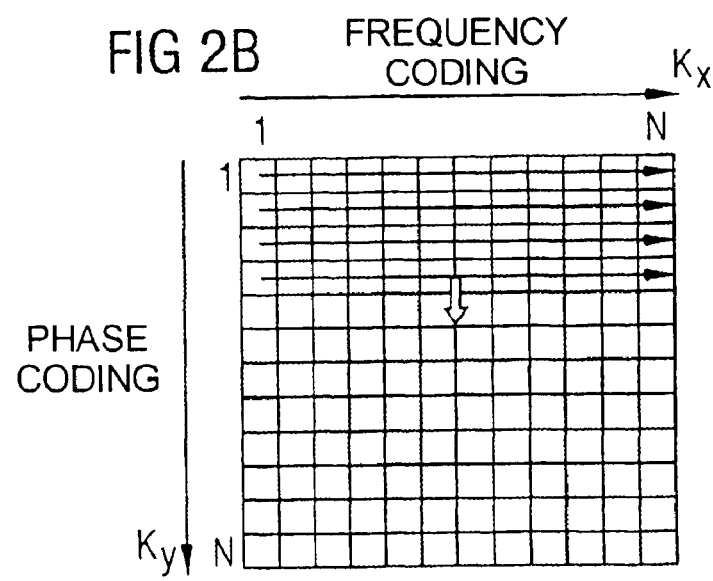

An example for the acquisition of data in an MRT measurement is shown in FIGS. 2a and 2b. The sequence used is a spin-echo sequence. In this, the magnetization of the spin is tilted in the x-y plane by a 90° excitation pulse. In the course of time (½ $T_E$; $T_E$ is the echo time) it amounts to a dephasing $\Delta\phi$ of the magnetization portions that mutually form the transverse magnetization in the x-y plane $M_{xy}$. After a certain time (for example, ½ $T_E$), a 180° pulse is emitted in the x-y plane such that the dephased magnetization components are reflected without the precession direction and precession speed of the individual magnetization portions being changed. After a further time duragtion ½ $T_E$, the magnetization components again point in the same direction, i.e. it amounts to a regeneration of the transverse magnetization, known as "rephasing". The complete regeneration of the transverse magnetization is designated as a spin-echo.

In order to measure an entire slice of the subject to be examined, the imaging sequence is repeated n-times for different values of the phase coding gradient, for example $G^y$, with the frequency of the magnetic resonance signal (spin-echo signal) in each sequence passing through the $\Delta t$-clocked analog-digital converter ADC being scanned, digitized, and stored N-times in equidistant time steps $\Delta t$ in the presence of the readout gradient $G^x$. In this manner, one obtains according to FIG. 2 a numerical matrix (matrix in the k-space matrix or k-matrix) generated line by line with N×N data points. A symmetrical matrix with N×N points is only one example; asymmetrical matrices or other k-space arrangements can be generated. From such data sets in k-space, MR images of the slice under consideration with a resolution of N×N pixels can be directly reconstructed by Fourier transformation.

The readout must be completed in an amount of time that is small with regard to the decomposition (dismantling) of the transverse magnetization $T_2$. Otherwise, the different lines of the k-matrix would be differently weighted corresponding to the order of their detection: specific spatial frequencies would be overemphasized, others would in contrast be underemphasized.

In one example of a diffusion-weighted spin-echo measurement, (scan) according to FIG. 3 a constant strong diffusion gradient 25 is applied. If the spin is tilted (rotated) in the x-y plane by the 90° pulse, it initially comes to lie precisely on an axis (for example, the x-axis). The spin now begins to dephase in the strong additional field of the diffusion gradient 25, meaning after a certain time it is at a certain angle φ. This temporal angle curve φ—also designated as phase φ—is, according to FIG. 3, dependent on the duration (in the case of a temporally limited diffusion gradient pulse) and the strength of the applied diffusion gradient 25. After a certain time (TE/2), the 180° pulse is emitted. At this point in time, the magnetization has achieved a dephasing of $\phi_1$. Via the 180° pulse, the magnetization is inverted in the x-y plane ($-\phi_1$) and begins to rephase until the time TE achieves a maximum possible echo 23.

Given a diffusion-conditional spatial change, magnetically resonant material (for example water molecules) behaves differently between emission of the 90° pulse and emission of the 180° pulse at an arbitrary point in time T. If, for example, the molecules move to a higher diffusion gradient strength at a location, they are subject to a stronger dephasing at the higher local field in comparison to the non-moving material (phase $\phi_1$). If, in the simplified case, the moved diffused material remains at the new location, its magnetization undergoes an inversion via the 180° pulse in a larger phase $\phi_2$. Due to the higher local field, after the inversion the phase also has a steeper curve when viewed temporally, which causes the magnetization of the diffused material to exhibit an additional phase Δφ at the readout point in time TE. This has the result that the transverse magnetization of the moved material altogether provides a lesser echo signal 24 than the non-moving material.

Figure 4:
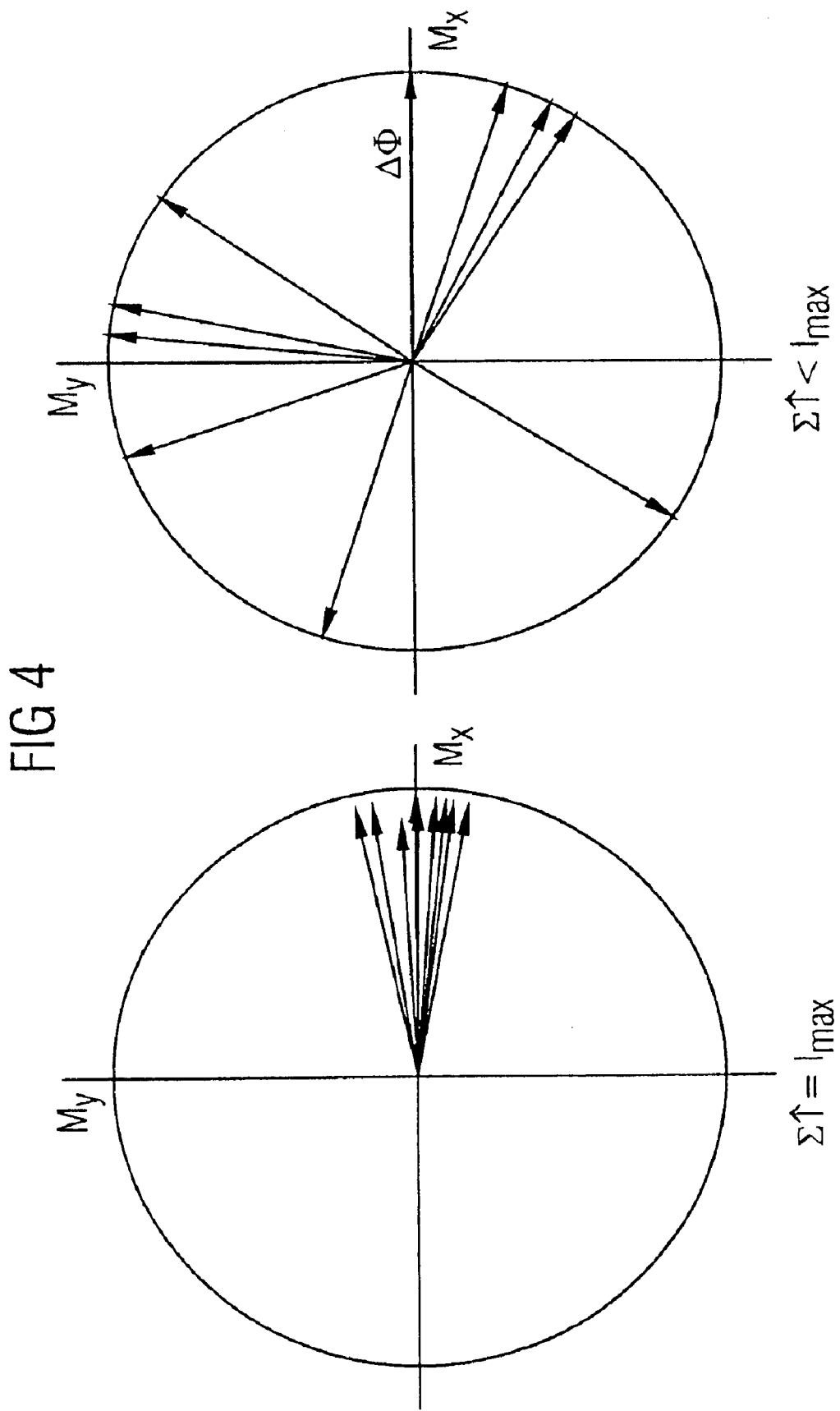
FIG. 4 schematically illustrates the phase curve $\phi$ of the transverse magnetization, comprised of magnetization components given rephrasing and diffusion-conditional dephasing in a spin-echo measurement.

This can be further illustrated using FIG. 4: On the left side, the transverse magnetization of the non-moving nuclear magnetic resonant material comprised of magnetization portions is shown vectorially at the echo point in time (TE). As can be seen, the magnetization again reaches its maximum value, which corresponds to the output value at the point in time of the 90° pulse ($\Sigma\uparrow=I_{max}$). It can be seen on the right side that the magnetization portions of the moved (diffused) nuclear magnetic resonant material occupies different phases Δφ at the echo point in time, and the vector sum therefore results in a lesser magnetization than would theoretically be possible $\Sigma\uparrow<I_{max}$)

In summary the greater the diffusion, meaning the spatial change of the magnetically resonant material in the gradient field, the less intense the magnetic resonance signal in this region. Regions exhibiting stronger diffusion become noticeable with regard to a signal attenuation.

The diffusion-weighted imaging in MRT requires markedly high diffusion gradient field strengths, since the effect described above is very small. However, given a strong but constant diffusion gradient—as fashioned in FIG. 3—there is the disadvantage that the readout of the echo also ensues under a strong gradient, and thus according to the relationship $$\text{Bandwidth} = \frac{1}{\text{Readout time}}$$

with a short readout time, due to the strong gradient, the signal is measured with higher bandwidth. A high bandwidth means that the actual magnetic resonance signal is measured in a very wide frequency band, and thus significant noise is measured with it.

For this reason, diffusion weighting and readout of the coded magnetic resonance signal are to be separated.

Figure 5:
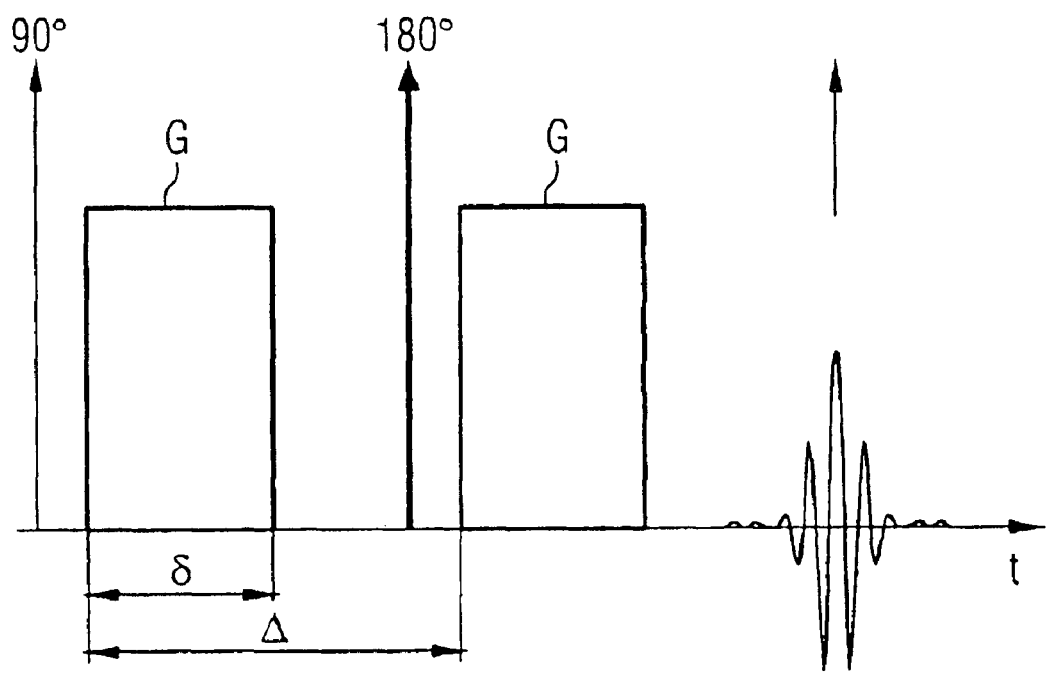
FIG. 5 schematically illustrates a Stejskal-Tanner diffusion-weighted spin-echo sequence.

A diffusion-weighted spin-echo sequence measurement with pulsed diffusion gradients was first published by Stejskal and Tanner (Stejskal and Tanner, Journal of Chemical Physics, 42, 288 (1965)) and is schematically shown in FIG. 5.

The pulse-shaped diffusion gradients $G_{Diff}$ have an amplitude ($G_{Diff} \approx 10 \times GR$) many times higher relative to the other field gradients ($G^S$, $G^P$, $G^R$), exhibit a defined temporal width δ, and have a definite temporal separation Δ from one another, that is also designated as a diffusion time.

The shown sequence has the advantage that the echo can be selected with very small bandwidth, because a very small readout gradient is used. Moreover, the defined quantities $G_{Diff}$, δ and Δ in particular establish the temporal characteristic of the diffusion measurement, such that the influence of the gradient pulses, their sequence in a diffusion-weighted MRT measurement can be mathematically described by a value known as the b-value:

$$b = \gamma^2 G_{Diff}^2 \delta^2 \left(\Delta - \frac{\delta}{3}\right) \left[\frac{s}{mm^2}\right]$$

wherein γ is the gyromagnetic ratio of the spin type under consideration (generally hydrogen). The physical value describing the diffusion, that is weighted with b, is generally designated as a "diffusion coefficient D" and represents, according to the relationship $$D \approx \frac{T}{\eta a^3} \left[\frac{mm^2}{s}\right]$$

a natural constant, wherein T is the temperature, η is the viscosity, and a is the molecular radius of the diffused material to be measured. The precise unit involves of a proportionality factor that is not specified here. In reality, a diffusion measurement is contaminated by further flow effects such as apparatus instabilities, flow movement artifacts, and so forth that must be taken into consideration in the diffusion coefficients D to be measured. For this reason, the designation "Apparent Diffusion Coefficient" (ADC) has become accepted as $D_{ADC}$, that—in order to acquire a diffusion-weighted MRT image—is to be measured in diffusion-weighted MRT experiments.

In a method known as the two-point method, a diffusion-weighted MRT image of a slice is acquired, by first measuring two diffusion-weighted images of the same slice with different b-values ($b_1$ and $b_2$), the $D_{ADC}$ is calculated per pixel from both these images, and this is represented in an image matrix of this layer.

The magnetic resonance signal of a diffusion-weighted measurement can be mathematically represented as $$S_{Diff} = S_0 * e^{\left(-\frac{T_E}{T_2}\right)} * e^{(-bD)}.$$

The factor $e^{(-bD)}$ is generally designated as a "diffusion weighting" and characterizes the signal conditional upon diffusion. By the second damping factor $$e^{\left(-\frac{T_E}{T_2}\right)},$$

the decomposition of the transverse magnetization described by T2 is taken into consideration during the echo time TE.

$S_0$ describes measurement and tissue parameters such as, for example, spin density, repetition time, flip angle and so forth.

By quotient formation, the $D_{ADC}$ value of each pixel can individually be calculated from both measurement values $S_1$ and $S_2$ of each pixel, as well as from both different b-values $b_1$ and $b_2$ as follows:

$$D_{ADC} = \ln\left(\frac{S_1}{S_2}\right) \Big/ (b_2 - b_1)$$

If the slice matrix is filled with the thusly-calculated $D_{ADC}$ values, a diffusion-weighted image of this layer is obtained. Different b-values typically are obtained by variation of the diffusion gradient parameters G, $\Delta$, and $\delta$. The values $S_1$ and $S_2$ are advantageously obtained with single-shot echo-planar imaging (SSEPI), due to the rapidity of the measurement method. Movement-conditional image artifacts can thereby be prevented. However, as already mentioned, the SSEPI sequence exhibits a strong $T_2$ sensitivity or phase sensitivity, dependent on the type of phase coding, that results in extremely severe image artifacts or distortion artifacts. Conventionally these have been accepted for want of alternatives.

M. H. Cho and C. H. Cho have already theoretically shown in the conference volume "Society of Magnetic Resonance in Medicine", p. 911, Amsterdam (1989) that, in diffusion-weighted MRT imaging, given use of a bipolar diffusion gradient pulse and the knowledge of two diffusion-weighted SSFP (English: Steady-State Free Procession) signals $S^+$ and $S^-$ (respectively measured with and without diffusion gradient), a simple formula can be specified to calculate the diffusion coefficients $D_{ADC}$:

$$D_{ADC} = \frac{1}{2*b_{bip}} \ln \frac{S_0^- * S_{Diff}^+}{S_{Diff}^- * S_0^+},$$

wherein $S_0^-$ is the signal of a PSIF sequence without diffusion gradients, $S_0^+$ is the signal of a FISP sequence without diffusion gradients, $S_{Diff}^-$ is the signal of a PSIF sequence with bipolar diffusion gradients $G_{Diff}$, $S_{Diff}^+$ is the signal of a FISP sequence with bipolar diffusion gradients $G_{Diff}$, $b_{bip}$ is the b-value of the above diffusion-weighted bipolar PSIF or, respectively, FISP measurement.

Thus, from different images, the quotient is formed, logarithmized, and weighted with the corresponding b-value $b_{bip}$.

The formula cited above to determine the $D_{ADC}$ coefficients has the significant advantage that the use of steady-state signals (these are generated by means of the conventional spin-warp phase coding technology) is insensitive with regard to the artifacts under which a diffusion-weighted MRT measurement with EPI sequences suffers.

The use of a bipolar diffusion gradient technically represents no problem; the corresponding b-value $b_{bip}$ of the respective device configuration for a bipolar diffusion-weighted MRT measurement can be specified without anything further.

The experimental determination of the respective SSFP values ($S_0^-$, $S_0^+$, $S_{Diff}^-$, $S_{Diff}^+$) is theoretically realized via the temporal succession of a FISP sequence and a PSIF sequence or, respectively, in reverse. Such a procedure of the connection of both measurement sequences means for the most part a duplication of the measurement time, with the serious disadvantage connected with this that, due to the extraordinary sensitivity of FIDP and PSIF sequences with regard to flow and pulse interferences, artifacts are measured that significantly impair the diffusion-weighted image with regard to its quality.

In accordance with the present invention both signals $S^+$ and $S^-$ for the measurement of the SSFP signals necessary for the formula above are simultaneously acquired. Such a sequence is designated as a DESS sequence (Double Echo Steady State). DESS links the FISP sequence with the additional signal gain of the PSIF sequence and supplies a good $T_2$ contrast, in particular for tissue with longer relaxation time $T_2$, as is the case given fluid accumulations (for example in the case of joint injuries). For this, FISP and PSIF signals that are subsequently added are typically generated in the same sequence.

A DESS sequence is shown in FIG. 6. The FISP echo is generated after each excitation pulse a by the first rephasing pulse of the readout gradient. In this sense, FISP represents a gradient echo sequence. The dephasing and rephasing phase curve of the transverse magnetization vector of the FISP excitation is shown lightly crosshatched in the lower part of FIG. 6.

PSIF is a FISP sequence running backwards (hence the acronym PSIF). In the PSIF technique, use is made of the fact that each radio-frequency pulse exhibits not only an excited component but rather also a refocusing component. If a number of excitations of a PSIF pulse sequence are considered, the excitation causes a measurement refocusing on the transversal component (transverse magnetization) of the preceding measurement: the dephasing and rephasing phase curve of the transverse magnetization vector of the PSIF excitation is shown darkly cross-hatched in FIG. 6. An echo is generated that is selected with the second rephasing pulse of the readout gradient. Since the PSIF signal that is generated with the first excitation is first selected at the end of the cycle for the second excitation, the echo time is equal to the doubled repetition time. The resulting PSIF echo therefore exhibits a markedly high $T_2$ weighting. Strictly speaking, PSIF does not fall into the category of gradient echo sequences; here it is in fact a spin echo sequence. PSIF is thus insensitive with regard to existing susceptibilities.

The present invention uses the DESS sequence in diffusion-weighted MRT imaging. For this, in accordance with the invention the DESS sequence is measured once with bipolar diffusion gradients and a second time without diffusion gradients, and the bipolar diffusion gradient is directly switched between the readout of the FISP signal and the readout of the PSIF signal. In accordance with the invention the FISP and PSIF signals ($S^+$ and $S^-$) measured in the respective sequence are not added, but instead are stored separately (for example in the system computer 18) and are used in the formula above. The b-value $b_{bip}$, likewise required in the formula, is given by the amplitude and pulse width of the bipolar diffusion gradients. The $D_{ADC}$ value thus can be calculated for each pixel of the measured slice. The matrix representation of all $D_{ADC}$ values of the layer finally yields an artifact-free diffusion-weighted image.

A first embodiment of the inventive sequence in which a FISP and a PSIF signal is measured before or after a bipolar diffusion gradient pulse is shown in FIG. 7. The slice readout gradient GS is switched during the radio-frequency excitation pulse α. A rephasing readout pulse that generates a FISP echo signal follows directly after a dephasing pulse of the readout gradient $G^A$, given simultaneous phase coding via the phase coding gradient $G^P$. The time between radio-frequency pulse and FISP echo is designated as echo time TE+. After the acquisition of the FISP echo, the diffusion gradient pulse is switched in a bipolar manner with the gradient amplitude $G_0$ and the pulse width $\delta$, and subsequent to this the PSIF echo $S^-$ is selected via a further gradient pulse of the readout gradient. Just before the next radio-frequency excitation pulse, the PSIF readout gradient is switched in a rephasing manner, while the phase coding of the phase coding gradient is cancelled via a corresponding inverted phase coding gradient pulse. The time between acquisition of the PSIF echo and the next radio-frequency pulse is designated as te−, such that the echo time of the PSIF echo TE− can be specified via TE−=2*TR−te. As is customary, TR is the repetition time, meaning the time between successive radiation detector excitation pulses.

Strictly speaking, a PSIF echo is comprised of the refocusing of a number of pulses that are not necessarily successive, which leads to a complicated splitting with regard to the phase curve of both the transverse magnetization and the length-magnetization. This splitting can be shown simplified by what are known as echo paths, each of which exhibits another time curve, in particular another diffusion time $\Delta_i$. i indicates the number of the radiation detector pulses that are generated up to formation of the respective PSIF echo of a specific echo path. The complexity, in particular of the PSIF signal generation, is compensated by the bipolarity of the diffusion gradient pulse as well as by the simultaneous readout of both echoes FISP and PSIF by more or less inverse readout gradient pulses. This is reflected in the simplicity of the formula according to Cho.

If the inventive sequence of FIG. 7 is compared with the conventional DESS sequence in FIG. 6, it stands out that the total symmetry of the pulses of the DESS sequence in FIG. 7 is not present. This is not necessarily required, but an advantageous aspect of the present invention and has the following reason. The FISP echo $S^+$ has by nature a higher signal-to-noise ratio (SNR) than the PSIF echo $S^-$, which is relatively small due to the relatively small refocusing portion of a radio-frequency excitation pulse. The readout of the PSIF echo $S^-$ therefore requires a long (viewed temporally) readout pulse (longer ADC, whereby again here the selecting analog-digital converter is meant by ADC). The readout of the FISP echo $S^+$ can ensue in a time many times shorter, whereby the readout gradient for this must exhibit a correspondingly higher amplitude. In other words, this means that the FISP echo can be measured with higher bandwidth—without SNR loss, so that overall, viewed over the entire temporal space of the measurement, the measurement time is significantly reduced.

If the FISP echo and the PSIF echo are measured according to the first embodiment of the present invention with different bandwidths, this can lead (for example due to the chemical displacement) to that the FISP image is acquired spatially displaced with regard to the generated PSIF image. In the quotient formation according to the formula by Cho, this leads to significant and therefore interfering artifacts. In order to prevent this, a second exemplary embodiment of the invention exists in which the PSIF echo is to be selected with what is known as an n-multi-echo sequence (n-multi-gradient echo sequence), as shown in FIG. 8 for n=3. Such an n-multi-echo sequence has a number (typically from 2n) of alternating gradient pulses of the same pulse width as that of the FISP echo readout pulse. This supplies n PSIF echo signals that are measured with the same bandwidth as the FISP echo. By addition and subsequent averaging (for example quadratic sum formation) of the individual acquired PSIF echo signals, however, the same sensitivity (SNR) is given as in a readout (ADC−) according to FIG. 7.

Furthermore, it is possible to apply the above-specified inventive simultaneous bipolar diffusion-weighted acquisition technique according to FIG. 9 to the known MRT projection-reconstruction method. The projection-reconstruction method (Lauterbur, N.Y. 1973) is one of the oldest imaging methods in magnetic resonance tomography and is presently undergoing a renaissance for different reasons. It is a method that enables the calculation of a digital image from a series of projections. For this (as in all other imaging methods in MRT, in particular in two-dimensional or three-dimensional Fourier transformation tomography), according to FIG. 9 an axial slice is excited or selected in the volume to be examined by a slice readout gradient GS. Directly after this, a consistent gradient $G_{image}$ is rotated by small angle increments $\Delta\phi$, whereby a projection is generated each time. According to this, the reconstruction of an image comprised of N×N pixels requires N independent projections that are defined by N points. The projections thus acquired in polar coordinates can be described in Cartesian coordinates by two orthogonal gradients $G_x$ and $G_y$. Without limitation of the generality, the following is valid:

$$G_y = G_{image} \sin(\phi),$$

$$G_x = G_{image} \cos(\phi).$$

The combination of the inventive sequence with the projection-reconstruction method effects a clear reduction of movement artifacts.

In conclusion, the bipolar diffusion-weighted MRT should be compared with the monopolar diffusion-weighted MRT via a rough estimation. The b-value of the classical Stejskal-Tanner diffusion sequence with monopolar gradient pulses (as it is shown in FIG. 5) is calculated according to the mathematical relationship already further mentioned above $$b_{mono} = \gamma^2 G_{Diff} \delta^2 \left(\Delta - \frac{\delta}{3}\right)$$

When the diffusion time $\Delta$ is equal to the pulse duration $\delta$ of the diffusion gradient ($\Delta = \delta$), then $$b_{mono} = \frac{2}{3}\gamma^2 G_{Diff}^2 \delta^3.$$

If overall the same pulse duration is used in the bipolar diffusion gradient circuit, then furthermore $$\delta_{bip} = \frac{1}{2}\delta_{mono}.$$

This means for the b-value of the inventive bipolar sequence that $$b_{bip} = 2 \text{ times } \frac{1}{8}b_{mono} = \frac{1}{4}b_{mono}$$

According to this, the b-value $b_{bip}$ required in the formula according to Cho can be calculated according to the following:

$$b_{bip} = \frac{1}{6}\gamma^2 G_0^2 \delta^3.$$

The above estimation shows that, for a tissue diffusion effect comparable with monopolar technology, diffsion gradients with an amplitude many times higher must be applied in the bipolar method.

The bipolarity of the diffusion gradient pulse $G_{Diff}$ of the inventive sequence has in addition the advantage that non-linearities or, respectively, distortions of the diffusion gradient pulse are compensated, conditional upon eddy currents that are induced in metallic conducting surfaces (cryoshields, shim plates, etc.) via formation and decomposition of the gradient field.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for acquiring a diffusion-weighted image in diffusion-weighted MRT imaging, comprising the steps of:
   (a) in a diffusion-weighted measurement, acquiring and storing a non-diffusion-weighted data set from a subject and a diffusion-weighted data set using a DESS sequence by switching two readout gradients successively for acquiring the non-diffusion-weighted data set, and by switching a bipolar diffusion gradient pulse sequence between two readout gradients for acquiring the diffusion-weighted data set; and
   (b) calculating a diffusion-weighted MRT image based on the non-diffusion-weighted data set and the diffusion-weighted data set, and based on a value characterizing the diffusion-weighted measurement.

2. A method as claimed in claim 1 comprising employing, as the bipolar diffusion gradient pulse sequence, a positive diffusion gradient pulse with an amplitude $G_0$ and a negative diffusion gradient pulse with an amplitude $-G_0$, said positive and negative diffusion gradient pulses having the same pulse width $\delta$ and one following directly after the other.

3. A method as claimed in claim 2 wherein step (b) comprises employing a b-value as said value characterizing the diffusion-weighted measurement, and calculating the diffusion-weighted MRT image by forming quotients of a combination of the diffusion-weighted data set and the non-diffusion-weighted data set, logarithmizing the quotients, and weighting the logarithmized quotients with the b-value.

4. A method as claimed in claim 3 wherein said diffusion-weighted MRT image is comprised of pixels, and wherein step (a) comprises conducting said diffusion-weighted measurement for a selected nuclear spin type, and wherein step (b) comprises forming the diffusion-weighted MRT image by representing each pixel by an ADC coefficient $D_{ADC}$ determined per pixel from the acquired data sets according to $$D_{ADC} = \frac{1}{2*b_{bip}} \ln \frac{S_0^- * S_{Diff}^+}{S_{Diff}^- * S_0^+},$$

wherein $S_0^+$ and $S_0^-$ represent the data set of the non-diffusion-weighted measurement as FISP echo signals and as PSIF echo signals, respectively, and $S_{Diff}^+$ and $S_{Diff}^-$ represent the data set of the diffusion-weighted measurement as FISP echo signals and as PSIF echo signals, respectively, and wherein $b_{bip}$ represents the value characterizing the diffusion-weighted measurement according to $$b_{bip} = \frac{1}{6}\gamma^2 G_0^2 \delta^3$$

wherein $\gamma$ is the gyromagnetic ratio of the nuclear spin type.

5. A method as claimed in claim 4 comprising acquiring the FISP echo signals for $S_0^+$ and $S_{Diff}^+$ with a bandwidth that is higher than a bandwidth employed for acquiring the PSIF echo signals for $S_0^+$ and $S_{Diff}^+$.

6. A method as claimed in claim 4 comprising acquiring the FISP echo signals for $S_0^+$ and $S_{Diff}^+$ with a bandwidth that is the same bandwidth employed for acquiring the PSIF echo signals for $S_{0+}$ and $S_{Diff}^+$ and acquiring the FISP echo signals for $S_0^+$ repeatedly using a multi-gradient echo sequence with averaging over all acquired signals for $S_0^+$, and acquiring the FISP signals for $S_{Diff}^+$ using a multi-gradient echo sequence with averaging over all acquired signals for $S_{Diff}^+$.

7. A method as claimed in claim 6 comprising employing a quadratic sum method for said averaging of $S_0^+$ and $S_{Diff}^+$.

8. A method as claimed in claim 4 comprising acquiring the data sets $S_{Diff}^-$, $S_{Diff}^+$, $S_0^-$, $S_0^+$ using a projection-reconstruction method.

9. A magnetic resonance imaging apparatus for acquiring a diffusion-weighted image in diffusion-weighted MRT imaging, comprising:
   a magnetic resonance scanner adapted to receive a subject, said scanner, in a diffusion-weighted measurement, acquiring and storing a non-diffusion-weighted data set and a diffusion-weighted data set from the subject using a DESS sequence by switching two readout gradients successively for acquiring the non-diffusion-weighted data set, and by switching a bipolar diffusion gradient pulse sequence between two readout gradients for acquiring the diffusion-weighted data set; and
   a processor for calculating a diffusion-weighted MRT image based on the non-diffusion-weighted data set and the diffusion-weighted data set, and based on a value characterizing the diffusion-weighted measurement.

10. An apparatus as claimed in claim 9 wherein said scanner generates, as the bipolar diffusion gradient pulse sequence, a positive diffusion gradient pulse with an amplitude $G_0$ and a negative diffusion gradient pulse with an amplitude $-G_0$, said positive and negative diffusion pulses having the same pulse width $\delta$ and one following directly after the other.

11. An apparatus as claimed in claim 10 wherein said processor employs a b-value as said value characterizing the diffusion-weighted measurement, and calculates the diffusion-weighted MRT image by forming quotients of a combination of the diffusion-weighted data set and the non-diffusion-weighted data set, logarithmizing the quotients, and weighting the logarithmized quotients with the b-value.

12. An apparatus as claimed in claim 11 wherein said diffusion-weighted MRT image is comprised of pixels, and wherein the scanner conducts said diffusion-weighted measurement for a selected nuclear spin type, and wherein the processor forms the diffusion-weighted MRT image by representing each pixel by an ADC coefficient $D_{ADC}$ determined per pixel from the acquired data sets according to $$D_{ADC} = \frac{1}{2*b_{bip}} \ln \frac{S_0^- * S_{Diff}^+}{S_{Diff}^- * S_0^+},$$

wherein $S_0^+$ and $S_0^-$ represent the data set of the non-diffusion-weighted measurement as FISP echo signals and as PSIF echo signals, respectively, and $S_{Diff}^+$ and $S_{Diff}^-$ represent the data set of the diffusion-weighted measurement as FISP echo signals and as PSIF echo signals, respectively, and wherein $b_{bip}$ represents the value characterizing the diffusion-weighted measurement according to $$b_{bip} = \frac{1}{6}\gamma^2 G_0^2 \delta^3$$

wherein $\gamma$ is the gyromagnetic ratio of the nuclear spin type.

13. An apparatus as claimed in claim 12 wherein the scanner acquires the FISP echo signal for $S_0^+$ and $S_{Diff}^+$ with a bandwidth that is higher than a bandwidth employed for acquiring the PSIF echo signals for $S_0^+$ and $S_{Diff}^+$.

14. An apparatus as claimed in claim 12 wherein the scanner acquires the FISP echo signals for $S_0^+$ and $S_{Diff}^+$ with a bandwidth that is the same bandwidth employed for acquiring the PSIF echo signals for $S_0^+$ and $S_{Diff}^+$, and acquiring the FISP echo signals for repeatedly using a multi-gradient echo sequence with the processor averaging over all acquired signals for $S_0^+$, and acquires the FISP signals for $S_{Diff}^+$ repeatedly using a multi-gradient echo sequence with the processor averaging over all acquired signals for $S_{Diff}^+$.

15. An apparatus as claimed in claim 14 wherein the processor employs a quadratic sum method for said averaging of $S^+$ and $S_{Diff}^+$.

16. An apparatus as claimed in claim 12 wherein the processor acquires the data sets $S_{Diff}^-$, $S_{Diff}^+$, $S_0^-$, $S_0^+$ using a projection-reconstruction method.

* * * * *